United States Patent
Song et al.

(10) Patent No.: US 8,907,208 B2
(45) Date of Patent: Dec. 9, 2014

(54) DYE-SENSITIZED SOLAR CELL INCLUDING A COLLECTOR

(75) Inventors: Mi Yeon Song, Seoul (KR); Sang Hak Kim, Seoul (KR); Yong Jun Jang, Gyeonggi-do (KR); Won Jung Kim, Seoul (KR); Yong Gu Kim, Gyeonggi-do (KR); In Woo Song, Gyeonggi-do (KR); Ji Yong Lee, Gyeonggi-do (KR); Ki Chun Lee, Seoul (KR)

(73) Assignee: Hyundai Motor Company, Seoul (KR)

( * ) Notice: Subject to any disclaimer, the term of this patent is extended or adjusted under 35 U.S.C. 154(b) by 348 days.

(21) Appl. No.: 13/295,310

(22) Filed: Nov. 14, 2011

(65) Prior Publication Data
US 2013/0056056 A1     Mar. 7, 2013

(30) Foreign Application Priority Data
Sep. 1, 2011 (KR) .................. 10-2011-0088558

(51) Int. Cl.
| | |
|---|---|
| H01L 31/00 | (2006.01) |
| H01M 14/00 | (2006.01) |
| H01L 51/44 | (2006.01) |
| H01G 9/20 | (2006.01) |
| H01L 31/0224 | (2006.01) |

(52) U.S. Cl.
CPC ...... *H01G 9/2068* (2013.01); *H01L 31/022433* (2013.01); *Y02E 10/542* (2013.01); *H01L 51/445* (2013.01); *Y02T 10/7022* (2013.01)
USPC .......................................... 136/263; 136/256

(58) Field of Classification Search
CPC . H01G 9/2068; H01G 9/2081; H01G 9/2077; H01L 51/445; H01L 31/022433
USPC .......................................... 136/263
See application file for complete search history.

(56) References Cited

U.S. PATENT DOCUMENTS

| 7,253,354 B2 * | 8/2007 | Van Roosmalen et al. ... 136/252 |
| 2006/0289057 A1 * | 12/2006 | Gonda et al. ................. 136/263 |

(Continued)

FOREIGN PATENT DOCUMENTS

| EP | 855726 A1 * | 7/1998 |
| JP | 11266028 A * | 9/1999 |

(Continued)

OTHER PUBLICATIONS

Machine translation of JP2006-107892A.*

(Continued)

*Primary Examiner* — Jeffrey T Barton
*Assistant Examiner* — Eric R Smith
(74) *Attorney, Agent, or Firm* — Edwards Wildman Palmer LLP; Peter F. Corless (57) ABSTRACT

Disclosed is a dye-sensitized solar cell. The dye-sensitized solar cell includes a working electrode and a counter electrode configured to join the working electrode. The working electrode includes a photo electrode having a plurality of photo electrode cells coated on a transparent conductive substrate and arranged in linear rows and a collector having a plurality of collector cells coated on the transparent conductive substrate and arranged along perimeters of the photo electrode and between the photo electrode cells and a collector bottom portion integrally interconnecting the collector cells. The collector cells have a same length or the collector cells arranged along the perimeters have a different length from the collector cells arranged between the photo electrode cells to increase an active area of the photo electrode.

25 Claims, 8 Drawing Sheets

(56) References Cited

U.S. PATENT DOCUMENTS

| | | |
|---|---|---|
| 2010/0012182 A1 | 1/2010 | Mori |
| 2011/0226325 A1 * | 9/2011 | Morooka et al. ............. 136/256 |

FOREIGN PATENT DOCUMENTS

| | | | |
|---|---|---|---|
| JP | 2006107892 A | * | 4/2006 |
| JP | 2008251517 A | | 10/2008 |
| JP | 2010027285 A | | 2/2010 |
| JP | 2010027393 A | | 2/2010 |
| JP | 2010034540 A | | 2/2010 |
| JP | 2010040432 A | * | 2/2010 |
| JP | 2010283313 A | | 12/2010 |
| KR | 10-1038770 | | 6/2011 |

OTHER PUBLICATIONS

M. Spath, et al., "Reproducible manufacturing of dye-sensitized solar cells on a semi-automated baseline", Progress in Photovoltaics 11, p. 207-220 (2003).*

Machine translation of JP2010-040432A.*

Machine translation of JP11-266028A.*

* cited by examiner

< STRUCTURE BEFORE JOINING DYE-SENSITIZED SOLAR CELL MODULE >

< STRUCTURE AFTER JOINING DYE-SENSITIZED SOLAR CELL MODULE >

DYE-SENSITIZED SOLAR CELL INCLUDING A COLLECTOR

CROSS-REFERENCE TO RELATED APPLICATION

This application claims under 35 U.S.C. §119(a) the benefit of Korean Patent Application No. 10-2011-0088558 filed Sep. 1, 2011, the entire contents of which are incorporated herein by reference.

BACKGROUND (a) Technical Field

The present invention relates to a dye-sensitized solar cell including a collector. More particularly, it relates to a dye-sensitized solar cell that can improve photo-electric conversion efficiency by maintaining an active area of a photo electrode to be as large as possible while using a collector for collecting a photo current.

(b) Background Art

As clean energy has recently begun to draw the attention of the automotive manufacturing world, photo-electric conversion devices such as solar cells have begun to be widely used. Among the solar cells, a silicon solar cell is already commercialized and applied as part of a sunroof installed in a vehicle. However, since the silicon solar cell has an opaque property and is expensive, its use is restricted.

Figure 1:
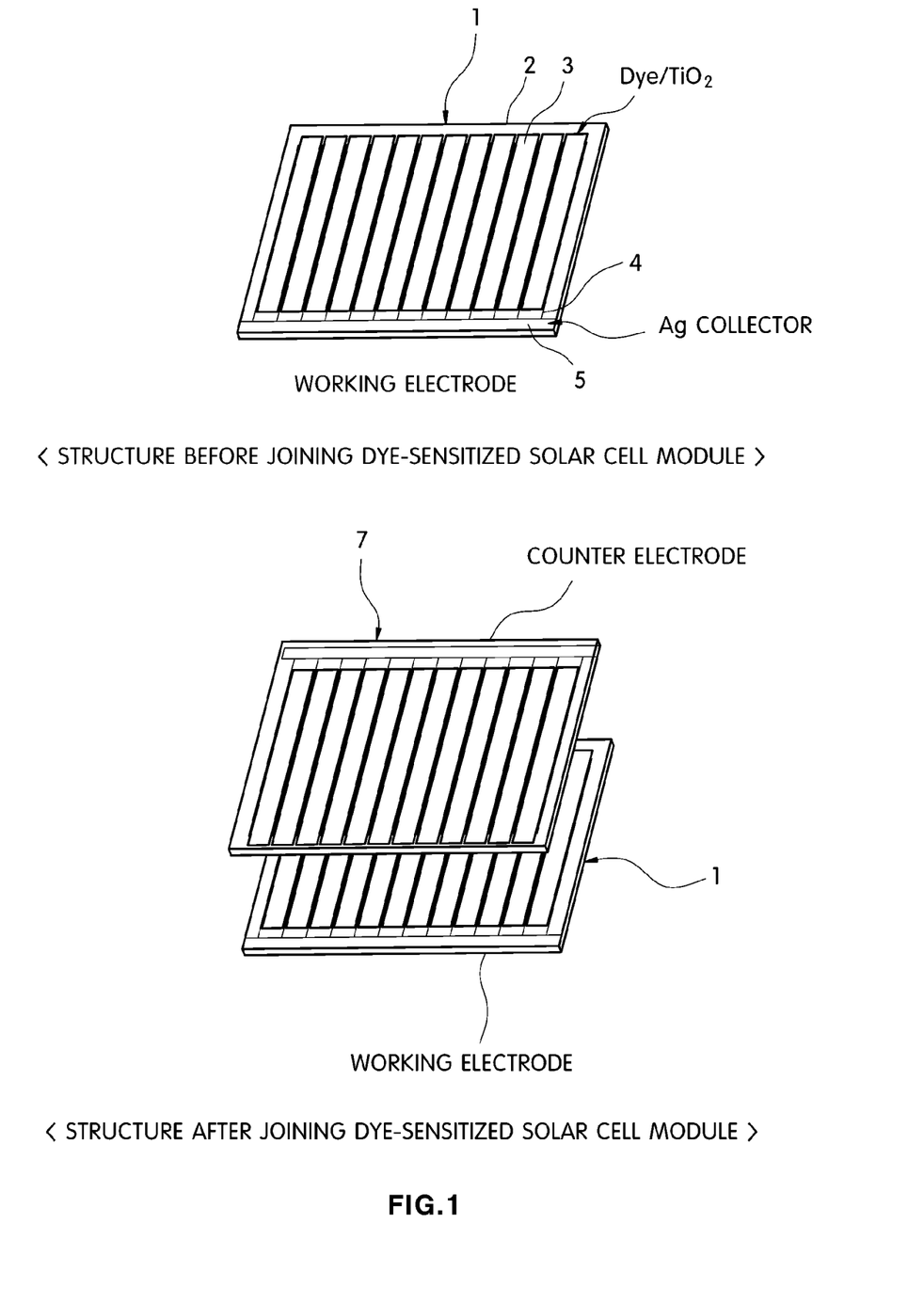
FIG. 1 is a schematic view of a conventional dye-sensitized solar cell.

Dye-sensitized solar cells that are spotlighted as translucent and transparent solar cells have been recently commercialized for various applications such as building integrated photovoltaic (BIPV), etc. Generally, as shown in FIG. 1, the dye-sensitized solar cell includes a working electrode and a counter electrode that are joined together. The working electrode includes a transparent conductive substrate on which a photo electrode (or a thick layer of an oxide semiconductor) such as $TiO_2$ in which a Ru-based dye that can absorb light is absorbed is coated. The counter electrode is coated with a catalytic electrode using Pt. $I^-/I_3^-$-based electrolyte is filled in a space between the working and counter electrodes.

The dye-sensitized solar cell is advantageous in that its manufacturing cost is relatively low, a transparent electrode can be manufactured, and it can be formed in a variety of different designs. Therefore, much research for the dye-sensitized solar cells has been performed. Particularly, research for applying the BIPV to the roof or windows of a building has been attempted. In addition, research for replacing the silicon solar cell that is currently applied to the roof of the vehicle with the dye-sensitized solar cell have been also attempted.

Figure 2:
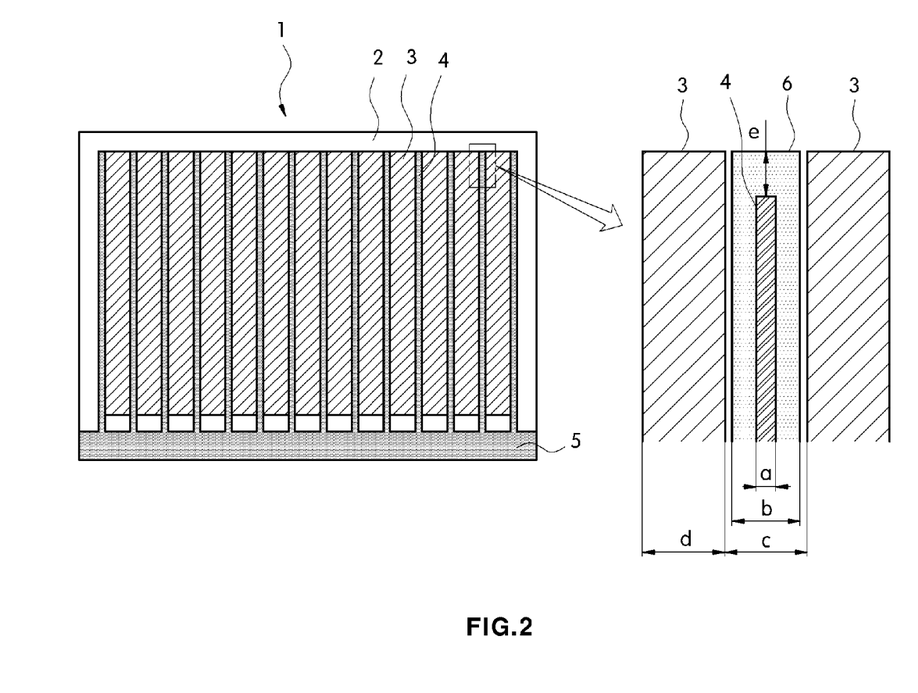
FIG. 2 is a schematic plan view of a conventional working electrode of a dye-sensitized solar cell.

In order to apply the dye-sensitized solar cell to a large-sized application, a collector for collecting a photocurrent should be used. Referring to FIGS. 1 and 2, a working electrode 1 of a dye-sensitized solar cell includes a transparent conductive substrate 2, $TiO_2$ photo electrodes 3 coated on the transparent conductive substrate 2, and collector cells 4 formed of a silver-based material and surrounded by a passivation layer 6. The collector cells 4 are arranged in lines and integrally connected with each other by a collector bottom portion 5 that is coated along a side edge of the transparent conductive substrate 2.

In addition, a counter electrode 7 includes a transparent conductive substrate, catalytic electrodes coated on the transparent conductive substrate, and collector cells that are thin and surrounded by a passivation layer. The collector cells extend to a collector bottom portion coated along a side edge of the transparent conductive substrate, thereby being integrally interconnected. A fill factor and a photocurrent value for the large-sized dye-sensitized solar cell are increased by using the collector. However, as the number of the collectors is increased, the active area of the photo electrode is reduced. Therefore, overall efficiency with respect to an aperture area is reduced.

In more detail, for the dye-sensitized solar cell modules having the same size, the areas of the photo electrodes may be different from each other by up to 50% in accordance with the structure of the collectors. As the area of the photo electrode is reduced, the photo current is reduced and thus the photo-electric conversion efficiency is reduced.

Figure 3:
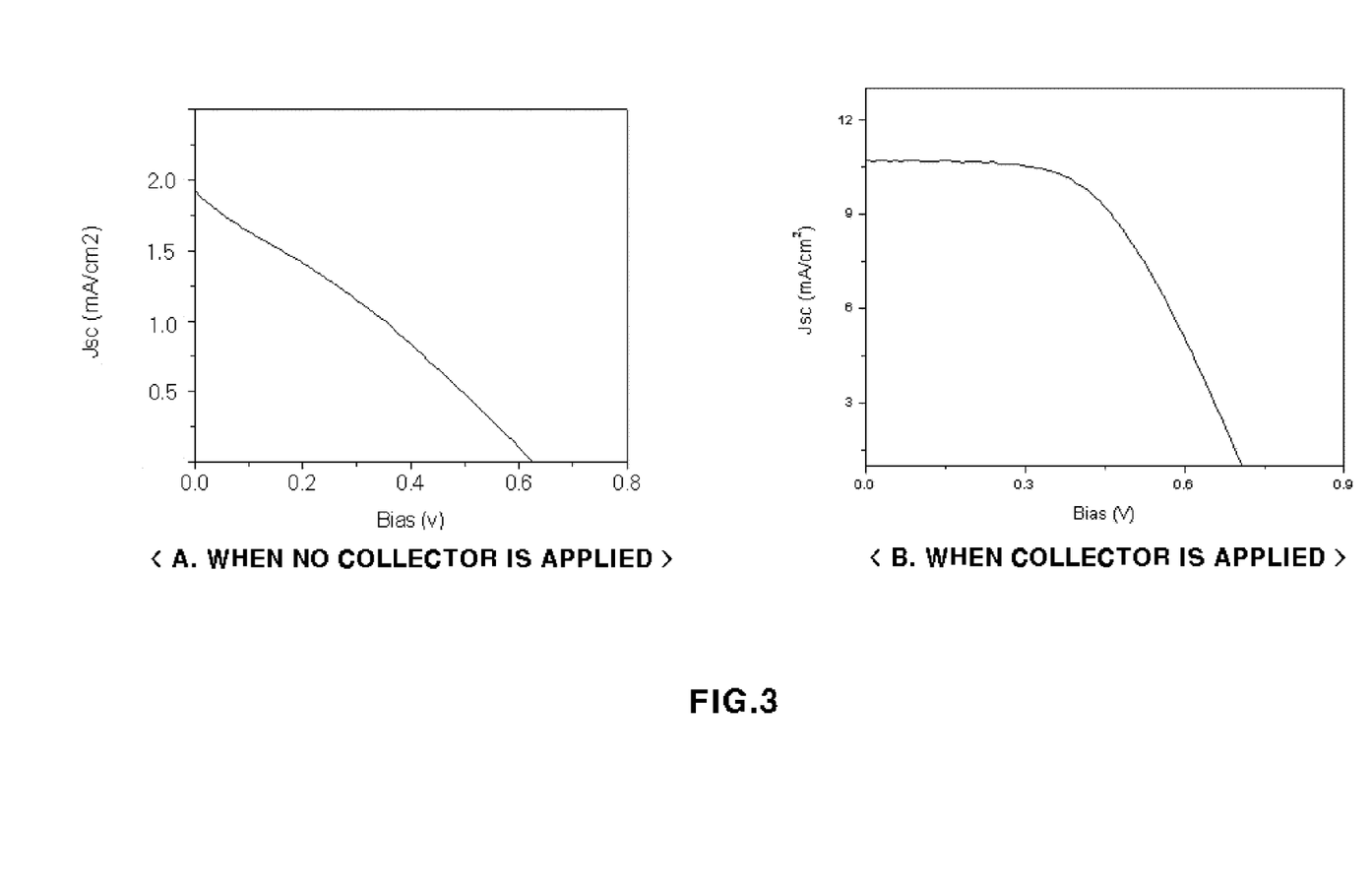
FIG. 3 is a view illustrating a photocurrent per unit area of a dye-sensitized solar cell in accordance with whether a collector is used.

FIG. 3 is a view illustrating a photo current of the dye-sensitized solar cell in accordance with whether the collector is used. Table 1 shows the photo current and fill factor of the dye-sensitized solar cells in accordance with whether the collector is used. As shown in FIG. 3 and Table 1, it was noted, for the dye-sensitized solar cell using a working electrode that is formed by coating $TiO_2$ on an entire surface of a transparent conductive substrate without using a collector, the fill factor is shown as a straight line of about 29.5% due to the increase of inner resistance. On the other hand, it was noted, for the dye-sensitized solar cell using a working electrode that is formed by forming a collector on the transparent conductive substrate, the fill factor is increased to 53%.

TABLE 1

| Module | Voc (V) | Jsc (mA/cm$^2$) | FF (%) | Efficiency (%) |
| --- | --- | --- | --- | --- |
| No collector | 0.62 | 1.90 | 29.5 | 0.35 (Ac: 68.89 cm$^2$) |
| Collector | 0.76 | 12.67 | 53 | 5.06 (Ac: 87.88 cm$^2$) |
| | | | | 4.45 (Ap: 100 cm$^2$) |

*Ac: Active Area AP: Aperture Area

Generally, when no collector is applied to the dye-sensitized solar cell, not only the fill factor but also the photo current is reduced. Therefore, it can be noted that, in order to increase the photocurrent and fill factor of the dye-sensitized solar cell module, the design of the collector for effectively collecting the photoelectrons is important.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention provides a dye-sensitized solar cell that can increase an active area of a photo electrode by varying the length and structure of collector cells of a collector, thereby improving photo-electric conversion.

In one aspect, the present invention provides a dye-sensitized solar cell including: a working electrode; and a counter electrode joining the working electrode. The working electrode includes a photo electrode having a plurality of photo electrode cells coated on a transparent conductive substrate and arranged in lines; and a collector having a plurality of collector cells coated on the transparent conductive substrate and arranged at the perimeters of the photo electrode and between the photo electrode cells and a collector bottom portion integrally interconnecting the collector cells. Furthermore, the collector cells have a same or similar length or the collector cells arranged at the perimeters have a different length from the collector cells arranged between the photo electrode cells to increase an active area of the photo electrode.

In an exemplary embodiment, the collector cells arranged at the perimeter may have a greater length than the collector cells arranged between the photo electrode cells and the collector cells arranged at the perimeters may linearly extend to corners of the photo electrode along left and right edges of the photo electrode, respectively.

In another exemplary embodiment, the collector cells arranged at the perimeters may extend along an upper end edge of the photo electrode and may be integrated with each other to define a collector upper end cell.

In still another exemplary embodiment, the collector upper end cell may have a mid-portion that is cut away, thereby separating the collector upper end cell into left and right sides.

In yet another exemplary embodiment, a distance between the left and right sides of the collector upper end cell may be same as a width of one photo electrode cell.

In still yet another exemplary embodiment, each of the collector cells may be formed in a trapezoid shape whose width is gradually increased toward the collector bottom portion.

In a further exemplary embodiment, each of the collector cells is formed in a trapezoid shape whose left and right sides may have a gradient of about 45~90°.

In another further exemplary embodiment, each of the photo electrode cells may be formed in a reversed trapezoid shape whose width is gradually reduced toward the collector bottom portion to uniformly maintain a distance between the collector cell and the photo electrode cell.

In still another further exemplary embodiment, each of the collector cells may have an upper end that is rounded such that corner portions of the upper end of the collector cells are not angled and a section of about 0-3 mm of the upper end of the collector cell at each corner portion may be rounded.

In yet another further exemplary embodiment, each of the photo electrode cells may have an upper end that is rounded such that corner portions of the upper end of the photo electrode are not angled and a section of about 0-3 mm of the upper end of the photo electrode at each corner portion may be rounded.

In still yet another further exemplary embodiment, the collector cells arranged between the photo electrode cells may be shorter than the collector cells arranged at the perimeters by about 0.01-7.00 mm or about 0.01-15.00 mm.

In a still further exemplary embodiment, a width of each of the photo electrode cells may be about 5-20 mm, a width of each of the collector cells may be about 0.05-1.00 mm, a distance between the collector cell and the photo electrode cell may be about 0.2-0.5 mm.

In a yet still further exemplary embodiment, a narrowest width of each of the collector cells may be about 0.01-0.90 mm, a widest width of each of the collector cells may be about 0.05-1.00 mm, a widest width of each of the photo electrode cells may be about 5-20 mm, and a narrowest width of each of the photo electrode cells may be about 4.1-19.9 mm.

In yet further exemplary embodiment, a passivation layer may be formed between the photo electrode cells to prevent the collector cells from being exposed to electrolyte.

In still yet exemplary embodiment, the counter electrode may include a catalytic electrode having a plurality of catalytic electrode cells coated on a transparent conductive substrate and arranged in lines; and a collector having a plurality of collector cells coated on the transparent conductive substrate and arranged at perimeters of the catalytic electrode cells and between the catalytic electrode cells and a collector bottom portion integrally interconnecting the collector cells, wherein the collector cells may have a same length or the collector cells arranged at the perimeters have a greater length than the collector cells arranged between the catalytic electrode cells to increase an active area of the catalytic electrode.

In still further exemplary embodiment, the collector cells arranged at the perimeters linearly may extend to corners of the catalytic electrode along left and right edges of the photo electrode, respectively.

In still yet further exemplary embodiment, the collector cells arranged at the perimeters may extend along an upper end edge of the catalytic electrode and may be integrated with each other to define a collector upper end cell.

In still further exemplary embodiment, the collector upper end cell may have a mid-portion that is cut away, thereby separating the collector upper end cell into left and right sides. At this point, a distance between the left and right sides of the collector upper end cell may be same as a width of one photo electrode cell.

In yet further exemplary embodiment, each of the collector cells may be formed in a trapezoid shape whose width is gradually increased toward the collector bottom portion. At this point, each of the collector cells may be formed in a trapezoid shape whose left and right sides have a gradient of about 45~90°.

In still yet further exemplary embodiment, each of the catalytic electrode cells may be formed in a reversed trapezoid shape whose width is gradually reduced toward the collector bottom portion to uniformly maintain a distance between the collector cell and the catalytic electrode cell.

In still further exemplary embodiment, each of the collector cells may have an upper end that is rounded such that corner portions of the upper end of the collector cells are not angled and each of the catalytic electrode cells may also have an upper end that is rounded such that corner portions of the upper end of the photo electrode are not angled.

Other aspects and exemplary embodiments of the invention are discussed infra.

BRIEF DESCRIPTION OF THE DRAWINGS

The above and other features of the present invention will now be described in detail with reference to certain exemplary embodiments thereof illustrated the accompanying drawings which are given herein below by way of illustration only, and thus are not limitative of the present invention, and wherein.

Reference numerals set forth in the Drawings includes reference to the following elements as further discussed below:

10: working electrode
11: transparent conductive substrate
12: photo electrode
13: photo electrode cell
14: collector
15: outermost collector cells
16: inner collector cells 17: collector bottom portion
18: collector upper end cell
19: passivation layer
20: counter electrode
21: transparent conductive substrate
22: catalytic electrode
23: catalytic electrode cells
24: outermost collector cells
26: inner collector cells
27: collector bottom portion
29: passivation layer.

It should be understood that the appended drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The invention relates to a dye-sensitized solar cell that is formed by joining a working electrode and a counter electrode. Particularly, the invention relates to a dye-sensitized solar cell having a collector that can effectively collect photoelectrons. The invention is characterized in that not only a photoelectron collecting performance is enhanced but also an active area of the photo and catalytic electrodes is also enhanced by applying a collector to the working and counter electrodes. In addition, a photo electrode cell and a collector cell that are referred in this invention are referred to as portions of the photo electrode and the collector, respectively.

Figure 4:
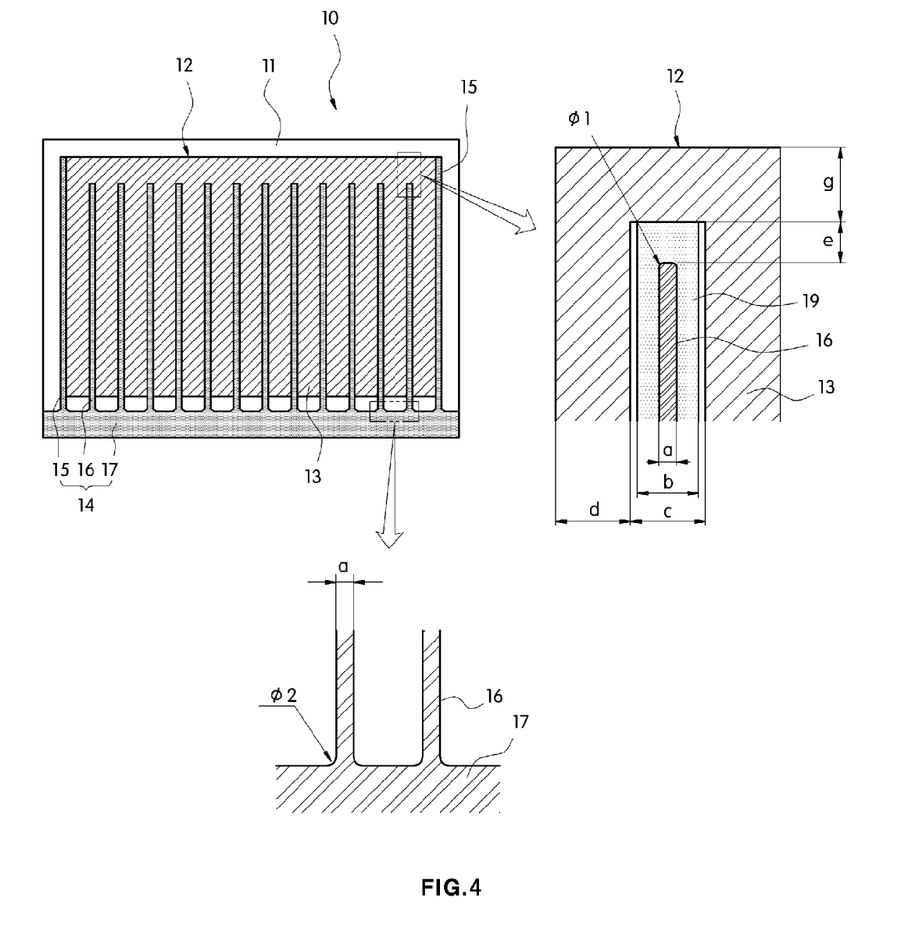
FIGS. 4 to 7 are schematic plan views of various working electrode of a dye-sensitized solar cell according to exemplary embodiments of the present invention.

A dye-sensitized solar cell of an exemplary embodiment of the present invention may include a working electrode 10. The working electrode 10 may include a transparent conductive substrate 11 and a photo electrode 12 and a collector 14 that are coated on the transparent conductive substrate 11. Referring to FIG. 4, the photo electrode 12 may include a plurality of photo electrode cells 13 that are arranged along lines in parallel with each other on the transparent conductive substrate 11. The collector 14 may include a plurality of outermost collector cells 15 that are arranged at the perimeters of the photo electrode 12 on the transparent conductive substrate 11, a plurality of inner collector cells 16 that are arranged between the photo electrode cells 13 on the transparent conductive substrate 11, and a collector bottom portion 17 that integrally interconnects the collector cells 15 and 16.

The collector bottom portion 17 may be coated on a side edge of the transparent conductive substrate 11 and disposed at a right angle to the outermost and inner collector cells 15 and 16. One end portions of the outermost and inner collector cells 15 and 16 are integrally interconnected by the collector bottom portion 17. As shown in FIG. 4, the outermost and inner collector cells 15 and 16 may be the same length. A predetermined distance may be maintained between the collector electrode bottom portion 17 and a lower end of the photo electrode 12.

In addition, a passivation layer 19 covering the outermost and inner collector cells 15 and 16 except for lower end sides connected to the collector bottom portion 17 may be formed between the photo electrode cells 13. The protective layer 19 prevents electrolyte between the working electrode 10 and the counter electrode 20 from being exposed, thereby protecting the outermost and inner collector cells 15 and 16 from the electrolyte and preventing the collector 14 from being corroded. The passivation layer 19 may be formed of glass frit, ultraviolet ray hardener, Surlyn, and the like. The photo electrode 12 may be formed of a $TiO_2$ electrode in which dye is absorbed. The photo electrode 12 generates photoelectrons when it receives light. The collector 14 may be formed of silver-based material to collect photocurrent generated by the photo electrode 12.

In addition, an active area is defined by a sum of active areas of the photo electrode cells 13, i.e., an active area of the photo electrode cells 13. An aperture area is a sum of the area of the photo electrode 12 and the areas of the collector 14 and passivation layer 19. The area except for the photo electrode 12 is a sum of the areas of the collector 14 and passivation layer 19 and the area between the collector 14 and passivation layer 19. The area except for the photo electrode 12 corresponds to a dead space. By minimizing the dead space when designing a dye-sensitized solar cell module, the photo-electric conversion efficiency can be improved.

As shown in FIG. 4, the outermost collector cells 15 may have a different length from the inner collector cells 16 that are disposed between the photo electrode cells. Particularly, the outermost collector cells 15 may be longer than the inner collector cells 16. In addition, the outermost collector cells 15 may linearly extend along an outer edge of the photo electrode 12 to the corners (far from the bottom portion of the collector bottom portion) of the photo electrode 12. Therefore, the lengths of the outermost collector cells 15 become almost same as those of the photo electrode cells 13. The inner collector cells 16 may be shorter than the outermost collector cells 15 and the photo electrode cell 13. That is, the inner collector cells 16 cannot reach an upper end edge of the photo electrode 12.

Accordingly, the photo electrode cells 13 are integrally connected with each other at the side of the transparent conductive substrate 11 and thus an inner resistance can be reduced and an overall active area of the photo electrode 12 can be increased. Further, in order improve filling efficiency, the outermost and inner collector cells 15 and 16 may have respective upper ends that are rounded such that corners Φ1 of the upper ends is not angled. A range from about 0 to about 3 mm of the upper end including each corner portion may be rounded. The photo electrode 12 or photo electrode cells 13 may have respective corners that are rounded such that the corners are not angled. A range from about 0 to about 3 mm including each corner may be rounded.

The outermost and inner collector cells 15 and 16 may have respective lower ends that are connected to the collector bottom portion 17 and enlarged in a roughly triangular shape such that respective corner portions Φ2 are not angled. Each of the corner portions Φ2 may be formed in a section ranged from about 0 to about 3 mm.

When the working electrode 10 is formed as shown in FIG. 4, in order to improve the efficiency of the dye-sensitized solar cell, a width d of each photo electrode cell 13 may be about 5-20 mm, the length of each inner collector cell 16 disposed between the photo electrode cells 13 may be less than that of each outermost collector cell 15 by about 0.01-7.00 mm, a width of each of the outermost and inner collector cells 15 and 16 may be about 0.05-1.00 mm, a distance e between an upper end of the passivation layer 19 and an upper end of each of the outermost and inner collector cells 15 and 16 may be about 0.01-2.00 mm, and a width b of the passivation layer 19 may be about a+2*e. In addition, a distance between each of the outermost and inner collector cells 15 and 16 and each of the photo electrode cells 13 may be about 0.2-0.5 mm. A length of each of the photo electrode cells 13 may be varied in accordance with the active area of the photo electrode.

The above-referenced sizes are exemplarily described, not limiting the present invention. Any structures that can minimize a filling loss of the solar cell module and maximize the active area of the photo electrode may be possibly applied.

Figure 5:
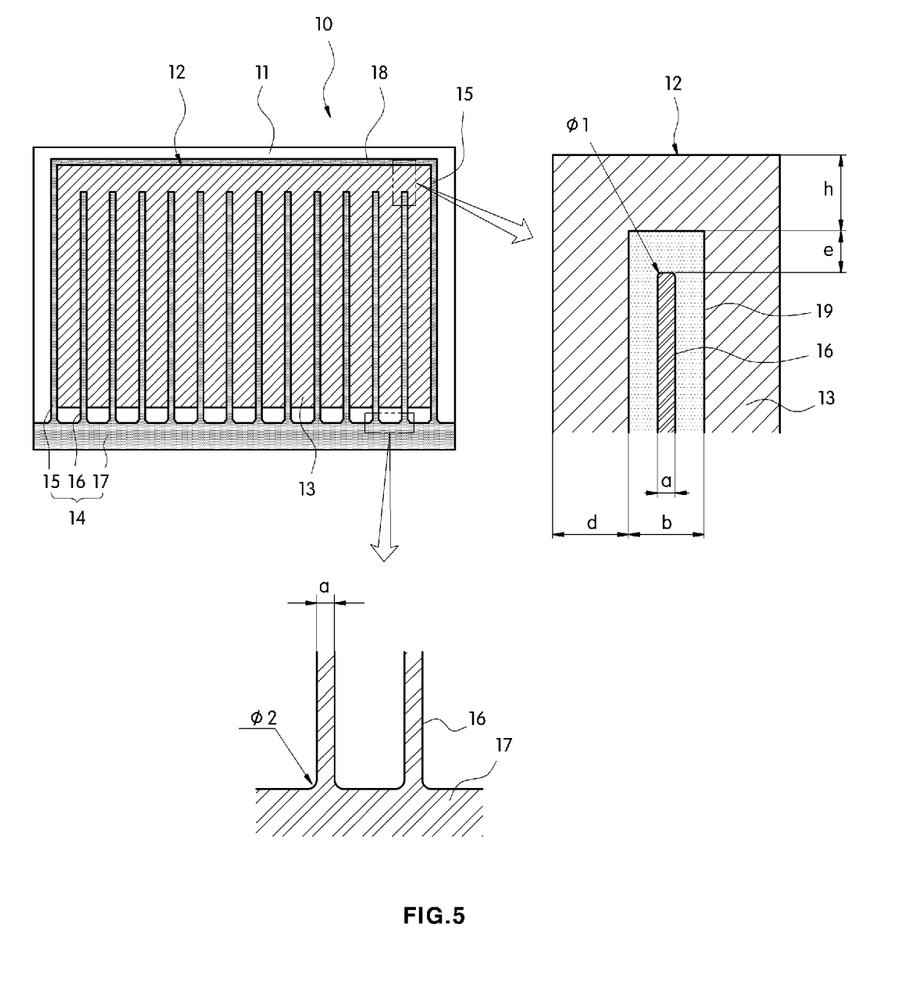

In addition, as shown in FIG. 5, the outermost collector cells 15 may be interconnected. That is, as shown in FIG. 5, the outermost collector cells 15 may straightly extend to the corners (far from the collector bottom portions) of the photo electrode 12 along left and right side edges of the photo electrode 12, be bent at right angles at the corners, and extend to be integrally connected with each other.

That is, the outermost collector cells 15 may linearly extend along the left and right side edges of the photo electrode 12, be bent at the right angles at the corners, and extend along the upper end edge of the photo electrode 12, thereby being integrated in a π-shape. When the working electrode 10 is formed as shown in FIG. 5, in order to improve the efficiency of the dye-sensitized solar cell, a width d of each photo electrode cell 13 may be about 5-20 mm, the length of each inner collector cell 16 disposed between the photo electrode cells 13 may be less than that of each outermost collector cell 15 by about 0.01-15.00 mm, a width a of each of the outermost and inner collector cells 15 and 16 may be about 0.05-1.00 mm, a distance e between an upper end of the passivation layer 19 and an upper end of each of the outermost and inner collector cells 15 and 16 may be about 0.01-2.00 mm, and a width b of the passivation layer 19 may be about a+2*e.

When it is intended to increase the active area of the photo electrode 12 by making the length of each of the collector cells 16 less than that of each of the outermost collector cell 15 by about 0.01-15.00 mm, as shown in FIG. 5, the outermost collector cells 15 may extend to the upper end edge of the photo electrode 12, thereby improving the photo-electric conversion efficiency.

Figure 6:
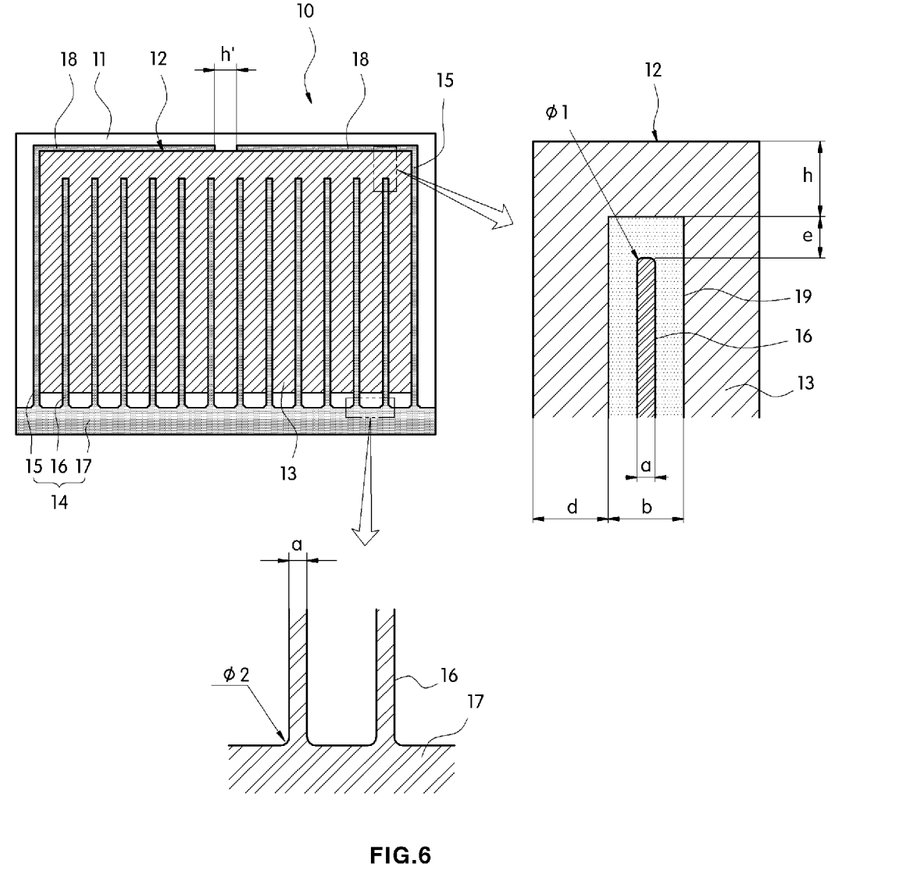

Hereinafter, the collector cell that extends from the upper ends of the outermost collector cells 15 and formed along the upper end edge of the photo electrode 12 will be referred to as a collector upper end cell 18. As shown in FIG. 6, the collector upper end cell 18 may have a mid-portion that is cut away. A cutting gap h' of the collector upper end cell 18 may be same as the width of the photo electrode cell 13.

Figure 7:
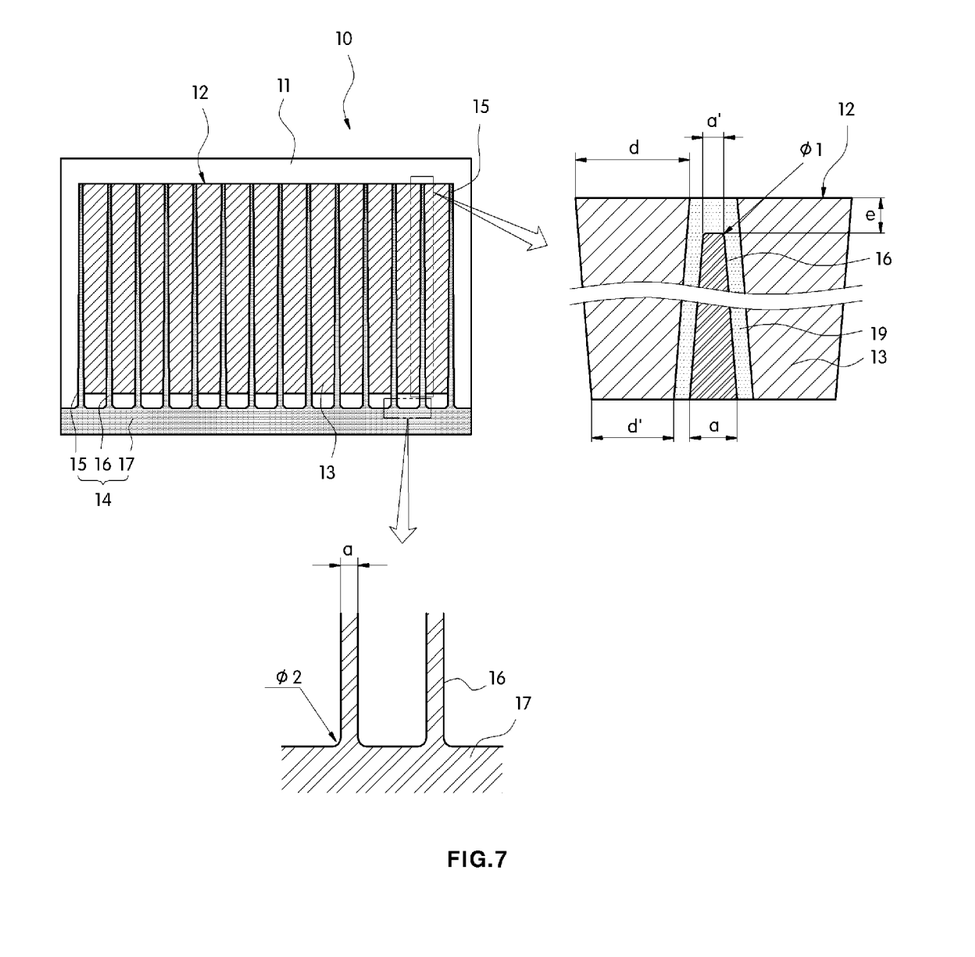

In addition, as shown in FIG. 7, each of the outermost and inner collector cells 15 and 16 may be formed in a trapezoid shape whose width is gradually reduced as it is closer to the collector electrode bottom portion 17. Since the an amount of the photocurrent that can be collected by the collector 14 is increased as it goes toward the collector bottom portion 17, the photocurrent collection efficiency can be improved by making the outermost and inner collector cells 15 and 16 in the trapezoid shape whose width is gradually increased as it is closer to the collector bottom portion 17. At this point, each of the outermost and inner collector cells 15 and 16 may be formed in the trapezoid shape whose left and right sides (facing the photo electrode cells) have a gradient of about 45-90°.

In addition, the photo electrode cells 13 may be also formed in the trapezoid shape in accordance with the shape of the outermost and inner collector cells 15 and 16 to uniformly maintain a distance between the outermost and inner cells 15 and 16 and the photo electrode cells 13.

To this end, the photo electrode cell 13 may be formed in a reversed trapezoid shape whose width is gradually reduced as it is closer to the collector bottom portion 17, thereby uniformly maintaining the distance between the outermost and inner collector cells 15 and 16 and the photo electrode cells 13. That is, the photo electrode cell 13 may be formed in the reversed trapezoid shape whose width is gradually increased from a lower end close to the collector bottom portion 17 to an upper end. At this point, the outermost and inner collector cells 15 and 16 may be the same length. Alternatively, as described above, the outermost collector cells 15 may have a different length from the inner collector cell 16.

When the working electrode 10 is formed as shown in FIG. 7, in order to improve the efficiency of the dye-sensitized solar cell, a width d of each photo electrode cell 13 may be about 5-20 mm, the length of each inner collector cell 16 disposed between the photo electrode cells 13 may be less than that of each outermost collector cell 15 by about 0.01-15.00 mm, a width a of each of the outermost and inner collector cells 15 and 16 may be about 0.05-1.00 mm, a distance e between an upper end of the passivation layer 19 and an upper end of each of the outermost and inner collector cells 15 and 16 may be about 0.01-2.00 mm, and a width b of the passivation layer 19 may be about a+2*e. The counter electrode 20 that is adjoined to the working electrode 10 to form the dye-sensitized solar cell module may be designed to have a collector structure identical to the working electrode 10. The structure of the counter electrode 20 may be described by replacing the photo electrode 12 of the working electrode 10 with a catalytic electrode 22 of the counter electrode 20.

Figure 8:
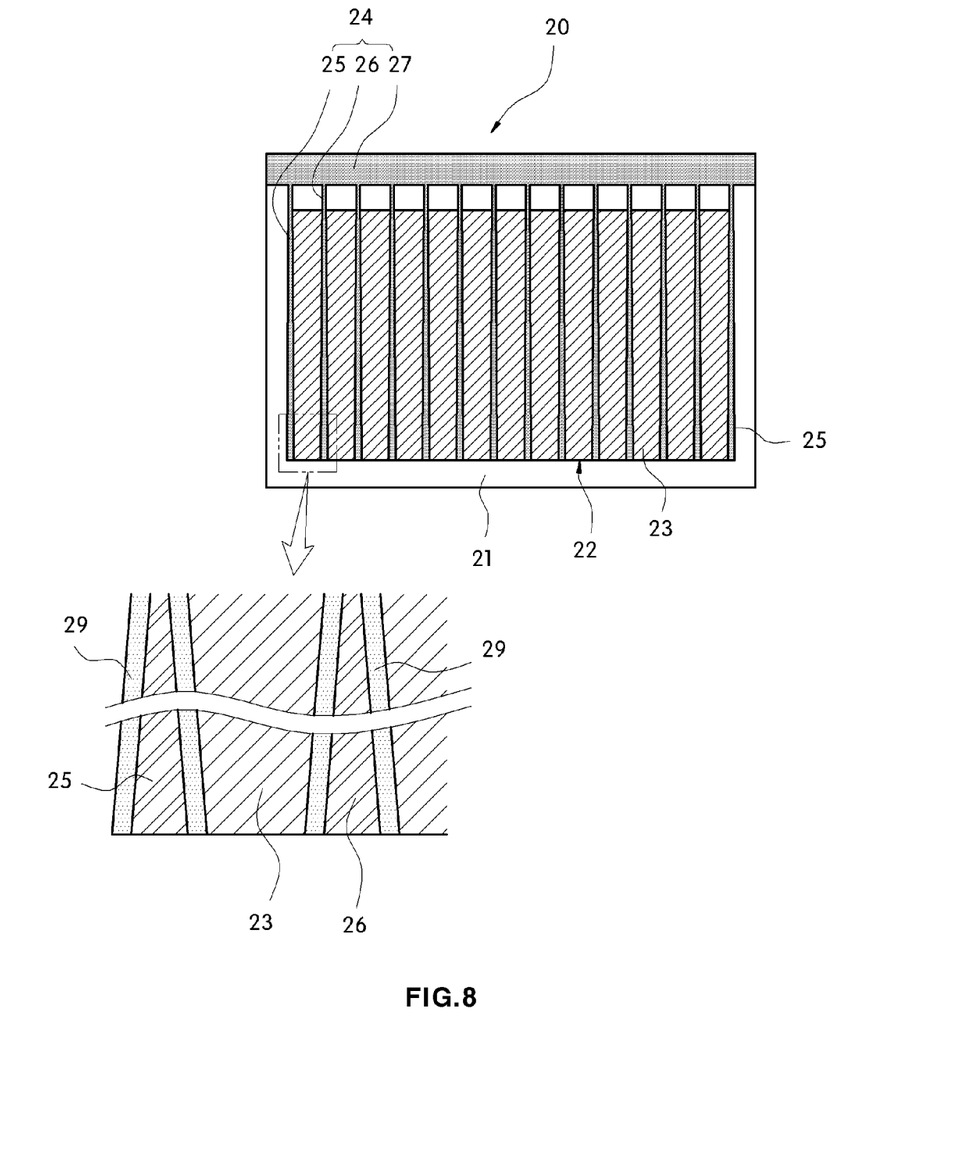
FIG. 8 is a schematic plan view of a counter electrode of a dye-sensitized solar cell according to an exemplary embodiment of the present invention.

Referring to FIG. 8, the counter electrode 20 may include a transparent conductive substrate 21 and a catalytic electrode and a collector 24 that are coated on the transparent conductive substrate 21. The platinum coated catalytic electrode 22 may include a plurality of catalytic electrode cells 23 that are arranged linearly on the transparent conductive substrate 21. The collector 24 may include a plurality of outermost and inner collector cells 25 and 26 that are arranged along the perimeters of the catalytic electrode 22 and between the catalytic electrode cells 23 on the transparent conductive substrate 21 and a collector bottom portion 27 that integrally interconnects the outermost and inner collector cells 25 and 26.

The collector bottom portion 27 may be coated on a side edge of the transparent conductive substrate 21 at a right angle to the outermost and inner collector cells 25 and 26. One end portion of each of the outermost and inner collector cells 25 and 26 are integrally interconnected by the collector bottom portion 27. The outermost and inner collector cells 25 and 26 may have a same length as each other. A predetermined distance may be maintained between the collector electrode bottom portion 17 and a lower end of the photo electrode 12. Alternatively, the outermost collector cells 25 may be longer than the inner collector cells 26. In addition, the outermost collector cells 25 may be connected with each other. Although not sown in the drawing, an upper end cell that extends from the outermost collector cells 25 and is formed on an upper end edge of the photo electrode 22 may be a mid-portion that is cut away.

As shown in FIG. 8, the outermost and inner collector cells 25 and 26 may be formed in a trapezoid shape whose width is gradually reduced as it goes toward the collector bottom portion 27. The catalytic electrode cells 23 may be also formed in the trapezoid shape in accordance with the shape of the outermost and inner collector cells 25 and 26 to uniformly maintain a distance between the outermost and inner cells 25 and 26 and the catalytic electrode cells 23. Since the collector bottom portions 17 and 27 are arranged along opposite sides when the counter electrode 20 and the working electrode 10 are joined together, the catalytic electrode cells 23 have a reversed trapezoid shape whose width is gradually reduced from an upper end close to the collector bottom portion 27 to a lower end.

The outermost and inner collector cells 25 and 26 may be the same length or the outermost collector cells 25 may have a different length from the inner collector cells 26 between the catalytic electrode cells 23.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents. For example, the above-described structures of the collector, photo electrode, and catalytic electrode can be applied to not only a planar type dye-sensitized solar cell module but also a curvature type dye-sensitized solar cell module.

Meanwhile, photo-electric conversion efficiencies of three dye-sensitized solar cell modules a, b, and c having the same area but provided with differently structured silver collectors were measured. From this measurement, it was noted that the modules a, b, and c have photo electrode active areas of 52 $cm^2$, 87.8 $cm^2$, and 91 $cm^2$, respectively. This shows that the active area of the photo electrode is remarkably varied in accordance with a structure of the collector.

In addition, it was also noted that, when the active area of the photo electrode is increased, a fill factor and photo voltage were similarly measured but the photo-electric conversion efficiency with respect to an aperture area was increased as shown in the below table 2.

TABLE 2

| Solar Cell Module | Active Area ($cm^2$) | Efficiency (%) (with respect to active area) | Efficiency (%) (with respect to aperture area) |
| --- | --- | --- | --- |
| a | 52 | 4.5 | 2.34 |
| b | 88 | 4.7 | 4.1 |
| c | 91 | 4.8 | 4.4 |

[Note]
The efficiency used in the solar cell is based on the aperture area

In addition, active areas of the respective photo electrodes when the outermost collector cells have a different length from the inner collector cells were measured (with respect to the aperture area of 1000 $cm^2$). From the measurement, it was noted that the active are of the photo electrode when the outermost and inner collector cells have a same length (related art) is greater than the active area of the photo electrode when the outermost collector cells have a different length from the inner collector cells (present invention).

TABLE 3

| Collector | Active area of photo electrode ($cm^2$) | Increase rate of photo electrode area | Remark |
| --- | --- | --- | --- |
| Same collector length | 87.88 | Reference | Structure of FIG. 3 is applied |
| Outermost/inner collector length variation (I) | 88.94 (89.87 when trapezoid collector is applied) | Increased by 1% as compared with the reference (Increased by 2.2% when trapezoid collector is applied) | Structure of FIG. 4 is applied |
| Outermost/inner collector length variation (II) | 87.88 | Increased by 1.4% as compared with the reference | Structure of FIG. 5 is applied |

According to the embodiments of the present invention, the collectors may be coated on the transparent conductive substrates of the working and counter electrodes to reduce the inner resistance and increase a collection rate of the photocurrent and structured to maximize the active area of the photo electrode, thereby improving the photo-electric conversion efficiency.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:
1. A dye-sensitized solar cell comprising:
a working electrode; and
a counter electrode joining the working electrode,
wherein the working electrode comprises:
   a photo electrode having a plurality of photo electrode cells coated on a transparent conductive substrate and arranged in lines; and
   a collector having a plurality of collector cells coated on the transparent conductive substrate and arranged along perimeters of the photo electrode and between the photo electrode cells and a collector bottom portion integrally interconnecting the collector cells,
   wherein the plurality of collector cells include a plurality of inner collector cells arranged between the photo electrode cells, and two outer collector cells arranged along the perimeters,
wherein the two outer collector cells have a different length from the inner collector cells to increase an active area of the photo electrode,
wherein the two outer collector cells and the plurality of inner collector cells extend vertically from the collector bottom portion,
wherein the plurality of collector cells further include a collector upper end cell integrally connected to the two outer collector cells and extending along an upper end edge of the photo electrode, and wherein the collector upper end cell is spaced apart from the plurality of inner collector cells has a mid-portion that is cut away, thereby separating the collector upper end cell into left and right sides and a distance between the left and right sides of the collector upper end cell is same as a width of one photoelectric cell.

2. The dye-sensitized solar cell of claim 1, wherein the two outer collector cells have a greater length than the plurality of inner collector cells.

3. The dye-sensitized solar cell of claim 1, wherein the two outer collector cells linearly extend to corners of the photo electrode along left and right edges of the photo electrode, respectively.

4. The dye-sensitized solar cell of claim 1, wherein each of the two outer collector cells and the plurality of inner collector cells is formed in a trapezoid shape whose width is gradually increased toward the collector bottom portion.

5. The dye-sensitized solar cell of claim 1, wherein each of the two outer collector cells and the plurality of inner collector cells is formed in a trapezoid shape whose left and right sides have a gradient of about 45~90°.

6. The dye-sensitized solar cell of claim 1, wherein each of the photo electrode cells is formed in a reversed trapezoid shape whose width is gradually reduced toward the collector bottom portion to uniformly maintain a distance between each of the two outer collector cells and the plurality of inner collector cells and the photo electrode cell.

7. The dye-sensitized solar cell of claim 1, wherein each of the two outer collector cells and the plurality of inner collector cells has an upper end that is rounded such that corner portions of the upper end of the collector cells are not angled.

8. The dye-sensitized solar cell of claim 1, wherein a section of about 0-3 mm of the upper end of each of the two outer collector cells and the plurality of inner collector cell is rounded.

9. The dye-sensitized solar cell of claim 1, wherein each of the photo electrode cells has an upper end that is rounded.

10. The dye-sensitized solar cell of claim 1, wherein a section of about 0-3 mm of the upper end of the photo electrode at each corner portion is rounded.

11. The dye-sensitized solar cell of claim 1, wherein the plurality of inner collector cells are shorter than the two outer collector cells by about 0.01-7.00 mm.

12. The dye-sensitized solar cell of claim 1, wherein the plurality of inner collector cells are shorter than the two outer collector cells by about 0.01-15.00 mm.

13. The dye-sensitized solar cell of claim 1, wherein a width of each of the photo electrode cells is about 5-20 mm, a width of each of the collector cells is about 0.05-1.00 mm, and a distance between the collector cell and the photo electrode cell is about 0.2-0.5 mm.

14. The dye-sensitized solar cell of claim 1, wherein a narrowest width of each of the collector cells is about 0.01-0.90, a widest width of each of the collector cells is about 0.05-1.00 mm, a widest width of each of the photo electrode cells is about 5-20 mm, and a narrowest width of each of the photo electrode cells is about 4.1-19.9 mm.

15. The dye-sensitized solar cell of claim 1, wherein a passivation layer is formed between the photo electrode cells to prevent the collector cells from being exposed to electrolyte.

16. The dye-sensitized solar cell of claim 1, wherein the counter electrode comprises:
 a catalytic electrode having a plurality of catalytic electrode cells coated on a transparent conductive substrate and arranged in lines; and
 a collector having a plurality of collector cells coated on the transparent conductive substrate and arranged along perimeters of the catalytic electrode cells and between the catalytic electrode cells and a collector bottom portion integrally interconnecting the collector cells of the counter electrode,
 wherein the collector cells of the counter electrode arranged along the perimeters have a greater length than the collector cells of the counter electrode arranged between the catalytic electrode cells to increase an active area of the catalytic electrode.

17. The dye-sensitized solar cell of claim 16, wherein the collector cells of the counter electrode arranged along the perimeters linearly extend to corners of the catalytic electrode along left and right edges of the photo electrode, respectively.

18. The dye-sensitized solar cell of claim 16, wherein the collector cells of the counter electrode arranged along the perimeters extend along an upper end edge of the catalytic electrode and are integrated with each other to define an collector upper end cell.

19. The dye-sensitized solar cell of claim 18, wherein the collector upper end cell has a mid-portion that is cut away, thereby separating the collector upper end cell into left and right sides.

20. The dye-sensitized solar cell of claim 16, wherein a distance between the left and right sides of the collector upper end cell is same as a width of one photo electrode cell.

21. The dye-sensitized solar cell of claim 16, wherein each of the collector cells of the counter electrode is formed in a trapezoid shape whose width is gradually increased toward the collector bottom portion.

22. The dye-sensitized solar cell of claim 16, wherein each of the collector cells of the counter electrode is formed in a trapezoid shape whose left and right sides have a gradient of about 45~90°.

23. The dye-sensitized solar cell of claim 16, wherein each of the catalytic electrode cells is formed in a reversed trapezoid shape whose width is gradually reduced toward the collector bottom portion to uniformly maintain a distance between the collector cell of the counter electrode and the catalytic electrode cell.

24. The dye-sensitized solar cell of claim 16, wherein each of the collector cells of the counter electrode has an upper end that is rounded such that corner portions of the upper end of the collector cells of the counter electrode are not angled.

25. The dye-sensitized solar cell of claim 16, wherein each of the catalytic electrode cells has an upper end that is rounded.

* * * * *